(12) United States Patent
Masumoto et al.

(10) Patent No.: US 6,172,711 B1
(45) Date of Patent: Jan. 9, 2001

(54) SYCHRONIZE PROCESSING CIRCUIT FOR MULTISCAN DISPLAY DEVICES

(75) Inventors: Junji Masumoto, Ibaraki; Yasuaki Sakanishi, Takatsuki, both of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/024,477

(22) Filed: Feb. 17, 1998

(30) Foreign Application Priority Data

Feb. 17, 1997 (JP) .................................................... 9-031614

(51) Int. Cl.[7] ....................................................... H04N 5/06
(52) U.S. Cl. ............................. 348/536; 348/537; 348/524
(58) Field of Search .................................. 348/536, 537, 348/521, 524, 539, 547; H04N 5/06

Primary Examiner—Sherrie Hsia
(74) Attorney, Agent, or Firm—Ratner & Prestia

(57) ABSTRACT

A synchronize processing circuit offers a stable supply of synchronizing signal to control circuits in display devices. A synchronize processing circuit for multiscan display devices which display one type of video signals of multiple video sources having different scanning frequencies comprises a PLL circuit for synchronizing regeneration of the synchronizing signal in the input video signal having a specified scanning frequency to output a regeneration clock; a controller for generating a control signal; a first pulse generator which receives a synchronizing signal in the video signal or the divided output signal of a divider built in the PLL circuit, control signal, and regeneration clock, and outputs a synchronizing signal with a specified phase and width; an AFC circuit for outputting a synchronizing signal; a deflection output circuit which receives the synchronizing signal output from the AFC circuit and feeds back a synchronizing signal with the same phase as a deflection current frequency to the AFC circuit; and a second pulse generator which receives the synchronizing signal output from the deflection output circuit and control signal, and outputs a synchronizing signal with a specified phase and width.

11 Claims, 13 Drawing Sheets

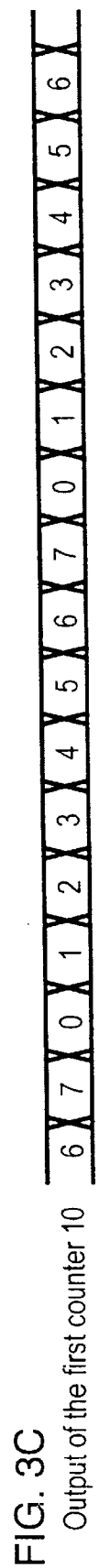
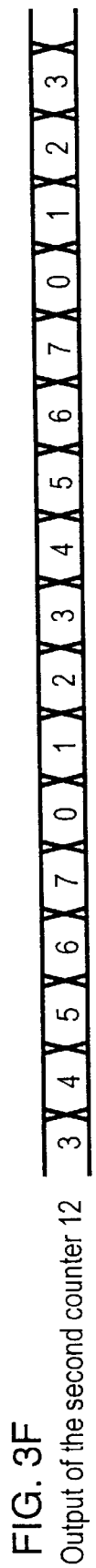
FIG. 3A Regeneration clock
FIG. 3B Synchronizing signal
FIG. 3C Output of the first counter 10
FIG. 3D Input of the comparator 11B
FIG. 3E Output of the comparator 11
FIG. 3F Output of the second counter 12
FIG. 3G Input of the comparator 13B
FIG. 3H Output of the comparator 13

FIG. 5A Clock 8 
FIG. 5B Output of Circuit 2 
FIG. 5C Output of AFC 3 
FIG. 5D Clock 8 
FIG. 5E Output of Circuit 2 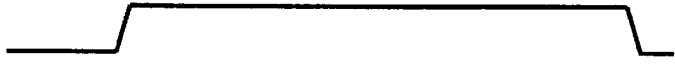
FIG. 5F Output of AFC 3 
FIG. 5G Clock 15 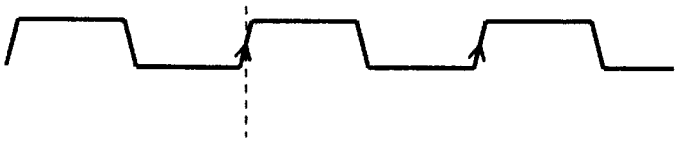

FIG. 7A Clock 8 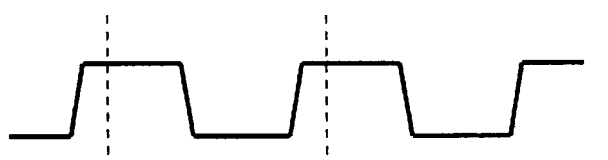
FIG. 7B Output of Circuit 2 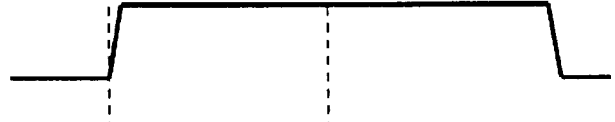
FIG. 7C Output of circuit 16 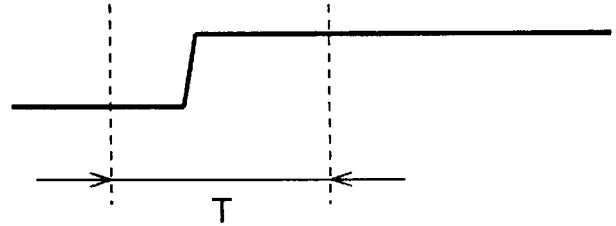

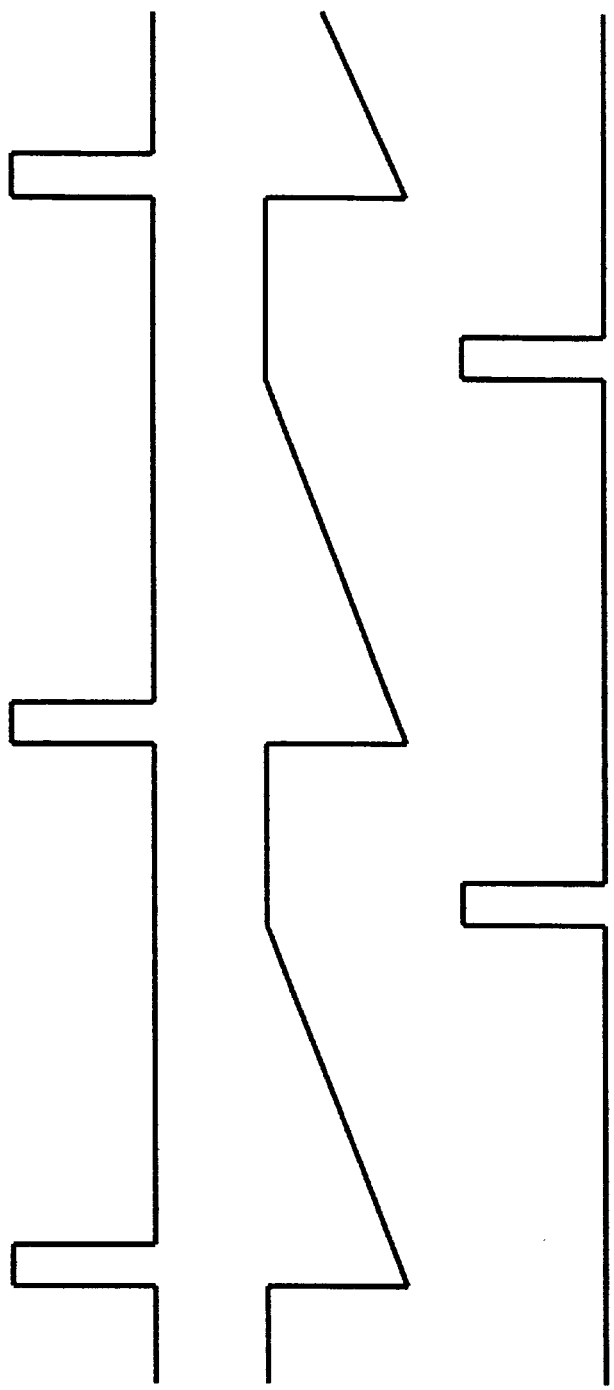

SYCHRONIZE PROCESSING CIRCUIT FOR MULTISCAN DISPLAY DEVICES

FIELD OF THE INVENTION

The present invention relates to the field of synchronize processing circuits in color television sets, display devices for regenerating synchronizing signals in video signals, and the supply of synchronizing signals with desired phases and widths to circuit blocks within color television sets and display devices.

BACKGROUND OF THE INVENTION

FIG. 12 shows a configuration of a synchronize processing circuit in accordance with the prior art. The synchronize processing circuit comprises a pulse phase setting circuit 37, a pulse width setting circuit 38, an AFC circuit 3, a deflection output circuit 4, a pulse phase setting circuit 39, a pulse width setting circuit 40, and a controller 6. Synchronizing signal 7 is received from an outside source. The operation of the synchronize processing circuit as configured above is explained below.

In FIG. 12, the synchronizing signal 7 input to the synchronize processing circuit from an outside source is supplied to an analog pulse generator 35 consisting of the pulse phase setting circuit 37 and the pulse width setting circuit 38. The analog pulse generator 35 is generally configured with a monostable multivibrator, so that the phase and width of the output signal in accordance with a control signal 9 from the controller 6.

FIGS. 13A to 13C show the operation of the analog pulse generator 35 configured with the monostable multivibrator. When the synchronizing signal 7 is supplied to the pulse phase setting circuit 37, a charging waveform responsive to a time constant determined by constants of a resistance element and capacitance element connected to the monostable multivibrator is created as shown in FIG. 13B. This charging waveform enables creation of a synchronizing signal shown in FIG. 13C which has a different phase from the synchronizing signal 7 shown in FIG. 13A. The phase setting is controllable by the control signal 9 output from the controller based on the time constant determined by the resistance element and capacitance element connected to the monostable multivibrator. A synchronizing signal with a specific pulse width is settable by supplying the output of the pulse phase setting circuit 37 (created as above) to the pulse width setting circuit 38 also configured with the monostable multivibrator. As explained above, a synchronizing signal with desired phase and width can be created from the synchronizing signal 7 input from the outside source to a display device by the use of the analog pulse generator 35 (which comprises the pulse phase setting circuit 37 and the pulse width setting circuit 38).

The AFC circuit 3 receives the output of the analog pulse generator as mentioned above. The AFC circuit 3 generates a synchronizing signal synchronized to the input synchronizing signal by controlling the oscillation frequency of an oscillator built in the AFC circuit 3. The synchronizing signal is output to the deflection output circuit 4. The synchronizing signal supplied from the deflection output circuit 4 to a deflection coil (not illustrated) is fed back to the AFC circuit 3 after its voltage is divided. This stabilizes the deflection output circuit 4.

An analog pulse generator 36 which has the same configuration as the analog pulse generator 35 receives a synchronizing signal with the same phase as, and synchronized to, the deflection current frequency of the display device. The synchronizing signal is input to the AFC circuit 3 from the deflection output circuit 4. Mis analog pulse generator 36 enables supply of the synchronizing signal with desired phase and width to each control circuit in the display device.

However, with the above configuration of the prior art, phase and signal width of the synchronizing signal supplied to control circuits are determined by the analog element. Accordingly, a stable signal may be difficult to achieve due to the effect of characteristics peculiar to analog elements such as deviation in constants and temperature characteristics.

Furthermore, in the configuration of the synchronize processing circuit of the prior art, range setting of the phase and width of the synchronizing signal output from the analog pulse generators 35 and 36 is determined by the analog element connected to the monostable multivibrator in the analog pulse generators 35 and 36.

If this type of circuit is employed in a multiscan display device which displays video images from video signal sources with a range of scanning frequencies, a percentage of a range setting of the phase and width of the synchronizing signal in one scanning frequency period may differ according to the scanning frequency of a video signal source input to the display device.

For example, if a variable range of the time constant of the analog element connected to the monostable multivibrator which determines the phase of the synchronizing signal is 5 $\mu$sec, a phase setting range of the synchronizing signal when an external video signal source with the horizontal scanning frequency of 100 kHz is connected is:

$$5\ \mu\text{sec}/(1/100\ \text{kHz}) = 50\%.$$

If the scanning frequency of the video signal source input from the outside source is 20 kHz, $$5\ \mu\text{sec}/(1/20\ \text{kHz}) = 10\%.$$

It is apparent that the phase setting range of the synchronizing signal is narrowed on the display device.

In addition, the control signal 9 output from the controller 6 is generally a digital signal with a specified resolving power. If the control signal 9 from the controller 6 is a digital signal line with 10-bit resolving power in the above example, phase setting accuracy in the synchronizing signal per bit is different by 5 times between the scanning frequencies of 100 kHz and 20 kHz of video signal sources input from the outside source. Consequently, phase adjustment accuracy in the prior art may differ with scanning frequencies of external video signal sources input to a display device.

SUMMARY OF THE INVENTION

A synchronize processing circuit for multiscan display devices is for displaying one type of video signal from multiple video signal sources with different scanning frequencies. A PLL circuit is for implementing synchronizing regeneration of a synchronizing signal in an input video signal having a specified scanning frequency and outputting a regeneration clock. A controller is for generating a control signal. A first pulse generator receives one of a synchronizing signal of the video signal and a dividing output signal from a divider built in the PLL circuit, the control signal, and the regeneration clock, and outputs a synchronizing signal having a desired phase and width. An AFC circuit is for outputting a synchronizing signal. A deflection output circuit receives the synchronizing signal output from the AFC circuit and feeds back a synchronizing signal with the same phase as the deflection current frequency to the AFC circuit. A second pulse generator which receives the synchronizing signal and control signal output from the deflection output circuit and outputs a synchronizing signal with a desired phase and width.

BRIEF DESCRIPTION OF THE DRAWINGS

FIGS. 3A to 3H are timing diagrams which are useful for explaining the operation of the pulse generator in accordance with the first exemplary embodiment of the present invention.

FIGS. 5A–5G are timing diagrams which are useful for explaining the operation of the synchronize processing circuit in accordance with the second exemplary embodiment of the present invention.

FIGS. 7A to 7C are timing diagrams which are useful for explaining the operation of the synchronize processing circuit in accordance with the third exemplary embodiment of the present invention.

FIGS. 13A to 13C are timing diagrams which are useful for explaining the operation of an analog pulse generator in accordance with the prior art.

DESCRIPTION OF THE PREFERRED EMBODIMENT

First exemplary embodiment

A synchronize processing circuit in accordance with a first exemplary embodiment of the present invention is explained with reference to FIGS. 1, 2, and 3A to 3H.

Figure 1:
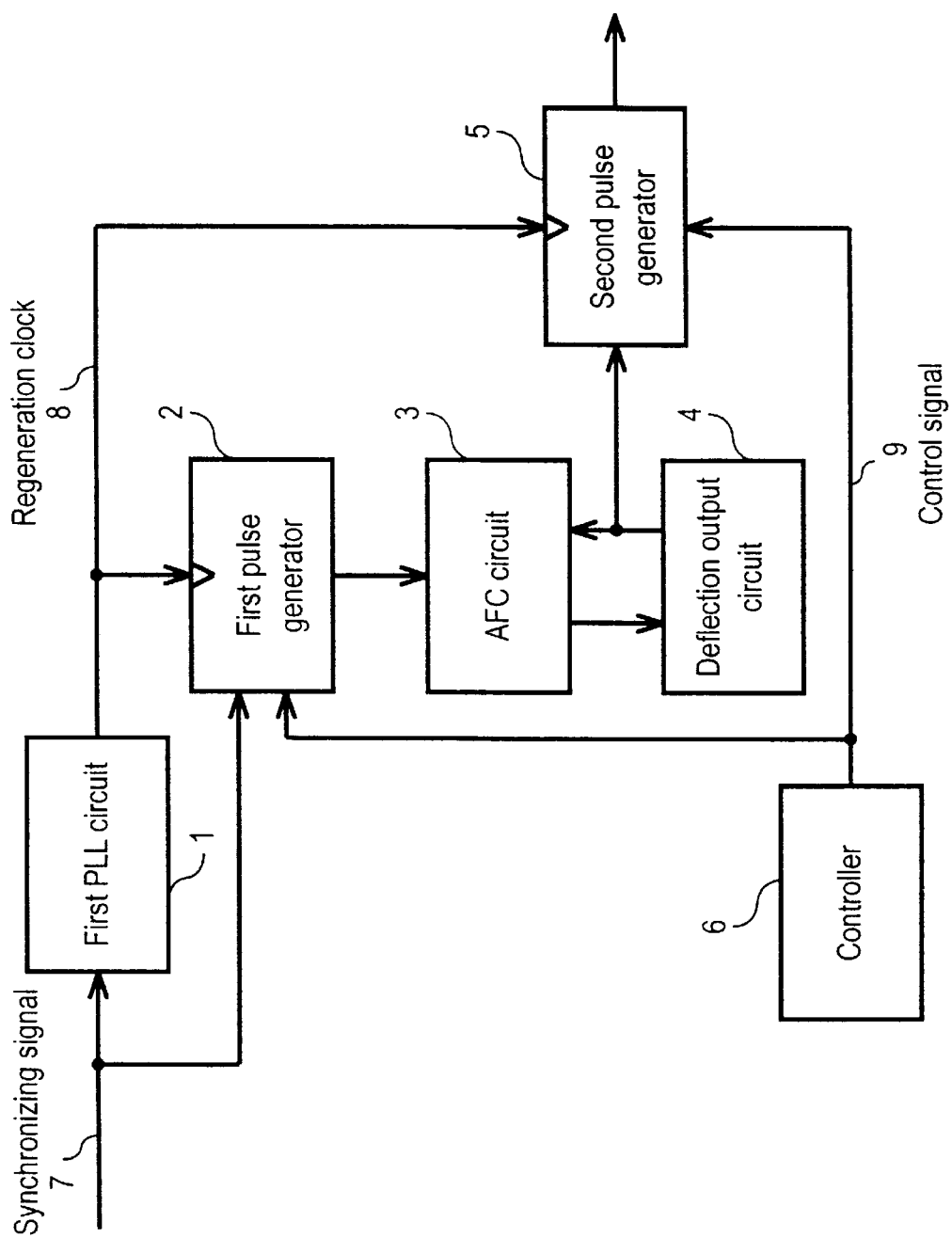
FIG. 1 is a block diagram of a synchronize processing circuit in accordance with a first exemplary embodiment of the present invention.

As shown in FIG. 1, the synchronize processing circuit in the first exemplary embodiment comprises a first PLL circuit 1, a first pulse generator 2, an AFC circuit 3, a deflection output circuit 4, a second pulse generator 5, and a controller 6. The synchronize processing circuit receives a synchronizing signal 7 of an external video signal source input to a display device. The operation of the synchronize processing circuit as configured above is explained below.

The first PLL circuit 1 receives the synchronizing signal 7 of the external video signal source input to the display device, and implements synchronizing regeneration. A voltage control oscillator (hereafter referred to as VCO) is included with the first PLL circuit 1, and this VCO generates a clock signal synchronized to the synchronizing signal input to the first PLL circuit 1, which is a first regeneration clock signal 8.

The first pulse generator 2 receives the first regeneration clock signal 8 generated by the synchronizing signal 7 and VCO, controls pulse phase and width of the input signal to specified values in accordance with the control signal 9 supplied from the controller 6, and outputs a further synchronizing signal to the AFC circuit 3.

Figure 2:
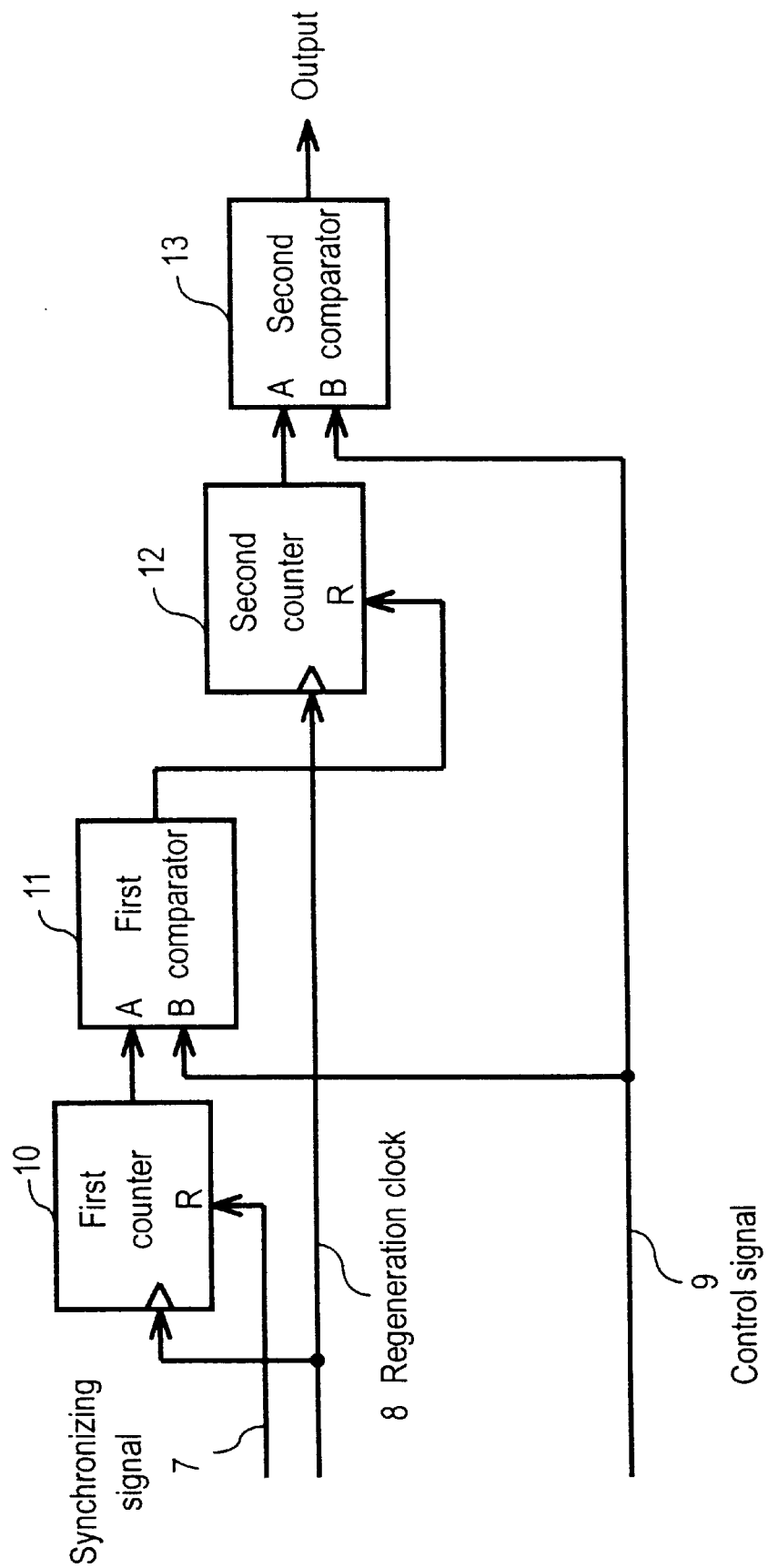
FIG. 2 is a block diagram of a pulse generator in accordance with the first exemplary embodiment of the present invention.
Figure 4:
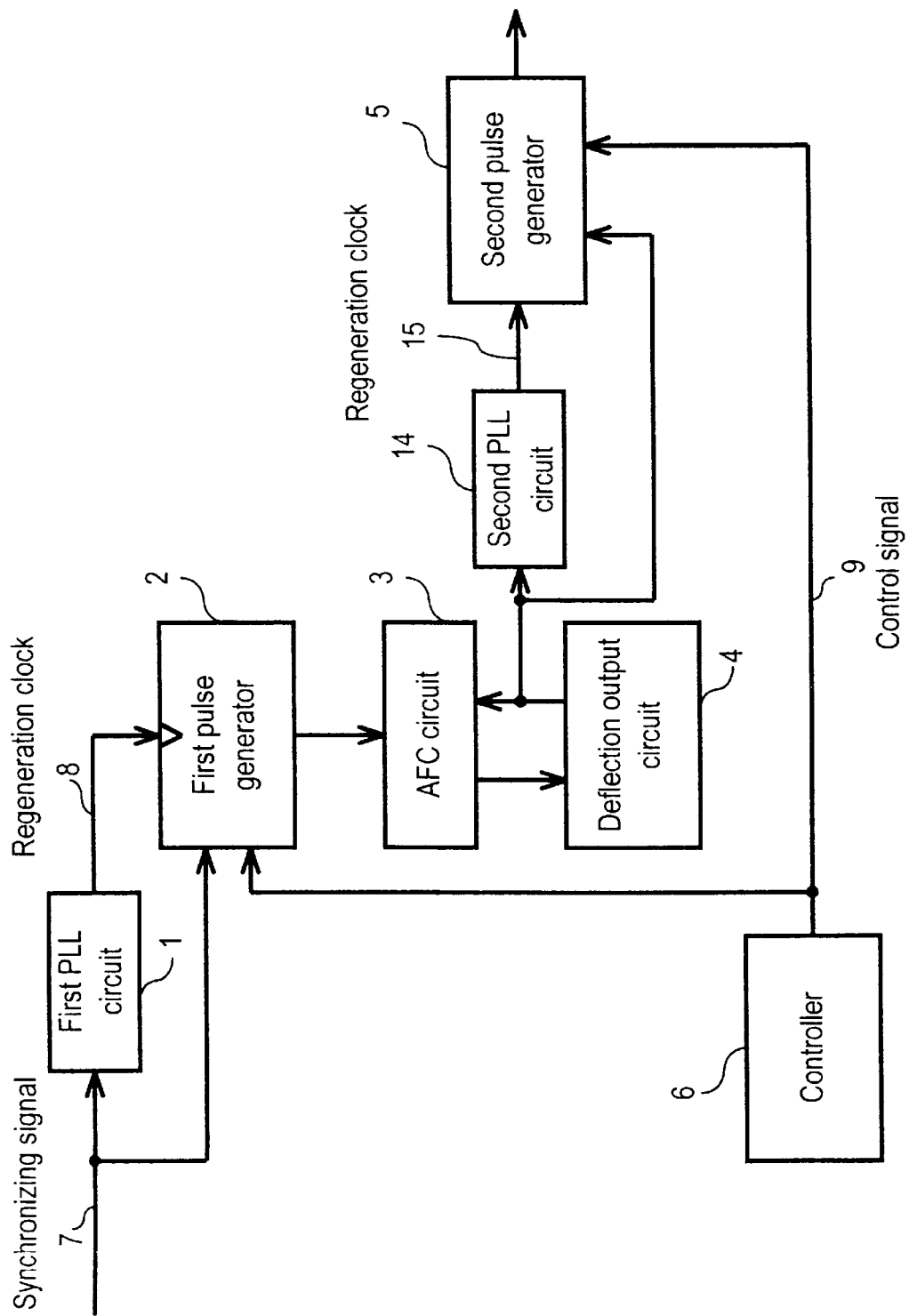
FIG. 4 is a block diagram of a synchronize processing circuit in accordance with a second exemplary embodiment of the present invention.

AFC circuit 3 includes two input terminals, which cause the frequencies of both input signals to agree. When no signal is fed to either or both of the input terminals, the AFC circuit can tap off an arbitrary signal. FIG. 2 shows the configuration of the first pulse generator 2, and FIGS. 3A to 3H show timing charts which are useful for explaining the operation of the first pulse generator 2.

The first pulse generator 2, shown in FIG. 2, comprises a first counter 10, second counter 12, a first comparator 11, and a second comparator 13 and is driven by the first regeneration clock 8 generated from the first PLL circuit The first counter 10 receives the first regeneration clock 8 generated from the first PLL circuit 1 synchronized to the synchronizing signal 7. The first counter 10 also receives the synchronizing signal 7 as a reset signal through a reset terminal of the first counter 10. The first regeneration clock 8 is divided by the synchronizing signal 7, and is output to terminal A of the first comparator 11. A signal used as the reset signal input to the reset terminal of the first counter 10 may be the division output of a divider built in the first PLL circuit 1 instead of the synchronization signal 7. The control signal 9 output from the controller 6 is input to terminal B of the first comparator 11.

Thus, synchronization signal 7 may be divided by the first PLL circuit 1. Synchronizing signal 7 may be multiplied by a VCO in the first PLL circuit 1 so that playback clock 8 is generated. This is described by the following equation:

frequency of input synchronization signal=playback clock frequency/n where "N" is an arbitrary integer.

When viewed from a frequency standpoint, the synchronization signal is multiplied. When viewed from a time standpoint, however, the synchronization signal is divided.

First comparator 11 may be configured to output a "1" only when signals input to the terminals A and B are equivalent.

FIGS. 3A to 3H are exemplary timing diagrams which are useful for explaining the operation of the first pulse generator 2. As shown in FIG. 3D, let's say the control signal 9 applied to the input terminal B of the comparator 11 from the controller 6 corresponds to a "2." In this case, the first comparator 11 outputs a "1". This indicates that the synchronizing signal of the first counter 10 is output only when the output of the first counter 10 to the input terminal A of the first comparator 11 corresponds to a "2." The first comparator 11 outputs a synchronizing signal with a specified phase based on the synchronizing signal 7 input to the first pulse generator 2 by changing a value, that is a set value, of the control signal 9 output from the controller 6. In order to set a pulse phase very accurately, it may be desirable to have a larger dividing ratio for the first PLL circuit 1 to avoid an effect of the dividing ratio of the divider built in the first PLL circuit 1 on the set value output from the controller 6.

The second counter 12 receives the first regeneration clock 8, the same as the first counter 10, and the synchronizing signal output from the first comparator 11 is input to its reset terminal as a reset signal.

One terminal A of the second comparator 13 receives the output signal of the second counter 12, and the other terminal B of the second comparator receives the control signal 9 output from the controller 6 same as the first comparator 11. The second comparator 13 compares two signals input to both terminals A and B.

Here, the judgment logic of the second comparator 13 is to output a "1" when a value input to the terminal A is the same or lower than a value input to the terminal B.

In FIG. 3G, assume that the control signal 9 input to the terminal B of the second comparator is "1." Then, the second comparator 13 outputs the synchronizing signal only when the output of the second counter 12 is "1" or below as shown in FIG. 3H.

The first pulse generator 2 thus enables output of a synchronizing signal with a specified width by setting a specified value to the control signal 9 output from the controller 6.

Accordingly, the first pulse generator 2 shown in FIG. 2 is capable of outputting a synchronizing signal having a desired phase and width based on the synchronizing signal of an external video signal source input to a display device.

The second pulse generator 5 in FIG. 1 has the same configuration as the first pulse generator 2. The second pulse generator 5 receives the first regeneration clock 8 generated by the first PLL circuit 1. The second pulse generator 5 receives a synchronizing signal with the same phase as the deflection current frequency of the display device (not illustrated) fed back from the deflection output circuit 4 to the AFC circuit 3. The deflection current frequency is the frequency of the deflection current running through the deflection coil of the display device. AFC circuit 3 feeds a pulse having an identical frequency with the deflection current frequency into the deflection output circuit. The deflection current of the display device tends to be delayed with respect to the input synchronization signal. The display device has a convergence circuit, focus circuit, etc. All these circuits work based on the deflection current pulse. If any of the circuits operate based on a pulse which is a deviation from the deflection current pulse, projection of the picture in the display could be distorted. The second pulse generator 5 thus outputs a synchronizing signal, controlled to a specified pulse phase and width in accordance with the control signal 9 supplied from the controller 6, to control circuits.

Accordingly, the second pulse generator 5 is capable of generating the synchronizing signal having a desired phase and width, and supplying it to a range of control circuits such as video circuit, convergence circuit, and focus circuit (not illustrated) in the display device.

The same effect may be achieved by employing judgment logic other than that explained in this exemplary embodiment for the first comparator 11 and the second comparator 13 forming the first pulse generator 2 shown in FIG. 2.

Since outputs of the first comparator 11 and the second comparator 13 usually generate spike noise at a switching point of the input signal for comparison, a latch circuit may be connected after the output signal of the first comparator 11 and the second comparator 13 for preventing erroneous judgment by spike noise in supplying the judgment result to the next circuit block.

Accordingly, the first pulse generator 2 outputs the synchronizing signal output from the first pulse generator 2 to the AFC circuit 3. Since the AFC circuit 3 consists of an analog element, a noise signal which may be generated in digital circuits of the first pulse generator 2 and the second pulse generator 5, and the first PLL circuit 1 producing a high-speed clock signal may enter the AFC circuit 3. The noise signal may cause unstable operation of the AFC circuit, preventing the supply of stable synchronizing signal to the deflection output circuit 4. As one way of addressing this issue, a digital circuit block may be physically separated from the AFC circuit which consists of the analog element so that the noise signal generated in digital circuits (hereafter referred to as digital noise) will not enter the AFC circuit 3.

Conversely, however, noise may be overlaid in a signal transmission line if the first pulse generator 2 and the second pulse generator 5 are separated from the AFC circuit 3. Another way of preventing entrance of digital noise to the AFC circuit 3 is to separate a power line and reference voltage (GND) line of both circuit blocks. This is a method to electrically separate both circuit blocks.

Still another way to prevent entrance of noise caused by irradiation and supply stable synchronizing signal to the deflection output circuit 4 is to shield the entire digital circuit block.

Using the above methods, a stable synchronizing signal may be supplied from the AFC circuit 3 to the deflection output circuit 4 by eliminating causes of unstable operation of the AFC circuit 3 due to the effect of the digital noise. By feeding back the stable synchronizing signal from the deflection output circuit 4 to the AFC circuit 3, stability of synchronization in the deflection output circuit 4 may be improved.

As explained above, the synchronize processing circuit of the present invention as configured above enables the supply of a desired synchronizing signal to control circuits without expanding the circuit scale by easily detecting the deflection starting phase of the display device.

Accordingly, the synchronize processing circuit of the present invention offers a simple circuit configuration for supplying the synchronizing signal, having a desired phase and width based on the synchronizing signal of the external video signal source input to the display device stably, to control circuits in the display device; thus allowing expansion of an applicable scanning frequency range.

Second exemplary embodiment

A synchronize processing circuit in accordance with a second exemplary embodiment of the present invention is explained next with reference to FIGS. 4, 5A–G. Differences from the configuration of the first exemplary embodiment in the second exemplary embodiment are that a second PLL circuit 14 is provided to receive the synchronizing signal fed back from the deflection output circuit 4 to the AFC circuit 3, instead of directly supplying the synchronizing signal to the second pulse generator 5, and that the second pulse generator 5 is driven by a second regeneration clock 15 output from this second PLL circuit 14. The same reference numerals are given to components which are also found in the first exemplary embodiment, and thus their explanation is omitted here.

First PLL circuit 1 and second PLL circuit 14 are of similar composition. Their frequency dividing rate may be identical or they may be different.

In the synchronize processing circuit shown in FIG. 1, the first pulse generator 2 and the second pulse generator 5 are driven by the common first regeneration clock 8 generated by the first PLL circuit 1. In this configuration, as shown in FIG. 5A–5C, the phase relation between the synchronizing signal output from the first pulse generator 2 and that from the first PLL circuit 1 sustains a latchable phase relation by the synchronizing signal 7 input to the first pulse generator 2 as a reset signal.

However, the synchronizing signal input from the deflection output circuit 4 to the AFC circuit 3 which is input to the downstream second pulse generator 5 as a reset signal may have the same phase as the first regeneration clock 8 generated by the first PLL circuit 1, as shown by a dotted line in FIG. 5A–5C, because the AFC circuit 3 is configured with the analog element.

If the output of the AFC circuit 3 which is input to the second pulse generator S has the same phase as the first regeneration clock 8, it may be unlatchable, resulting in the supply of an unstable synchronizing signal from the second pulse generator 5 to control circuits in the display device. This may cause degradation of video quality such as by vibration of the screen and jitter in the display device.

Therefore, in accordance with the second exemplary embodiment, the synchronizing signal fed back from the deflection output circuit 4 to the AFC circuit 3 is supplied to the second PLL circuit 14 instead of being directly supplied to the second pulse generator 5. The aforementioned problem may be solved by providing the second PLL circuit 14 to output the second regeneration clock 15 for driving the second pulse generator S. The operation of the synchronize processing circuit in this exemplary embodiment is explained with reference to the timing diagrams shown in FIG. 5D–5G. The configuration of the present embodiment, compared to the exemplary embodiment shown in FIG. 1, enables supply of a stable synchronizing signal from the second pulse generator 5 to control circuits in the display device even if the first regeneration clock 8 generated by the first PLL circuit 1 and the output of the AFC circuit 3 configured with the analog element have the same phase, as in the example shown by dotted line in FIG. 5F and FIG. 5G.

Two different clock signals with different phases generated by the first PLL circuit 1 and the second PLL circuit 14 exist in the synchronize processing circuit of this exemplary embodiment. This increases the desirability of reducing the effect to other circuits as explained in the first exemplary embodiment. In addition, the first and second regeneration clock signals 8 and 15 have different phases, but they are completely synchronized. This may cause erroneous operation of the pulse generator if the digital noise undesirably enters the pulse generator. To prevent this, it may be desirable to completely separate power supply and reference (GND) voltage of both PLL circuits 1 and 14, although both PLL circuits 1 and 14 are configured in the same digital circuit block, to avoid mutual electrical interference. Furthermore, the first PLL circuit 1 and the second PLL circuit 14 may desirably be disposed on a substrate in a way that current returning loops where the current is consumed between the power supply and each PLL circuit do not cross each other. This enables a reduction of interference of the PLL circuits.

With the above configuration, the synchronize processing circuit of the present invention offers a simple circuit configuration for generating the synchronizing signal having a desired phase and width based on the synchronizing signal in the external video signal source input to the display device. Further stable synchronizing signal desirable in each control circuit may be suppliable, compared to the configuration of the first exemplary embodiment, thus allowing further improvement in stability of synchronization of the display device.

Third exemplary embodiment

A synchronize processing circuit in accordance with a third exemplary embodiment of the present invention is explained next with reference to FIGS. 6 and 7A to 7C. The third exemplary embodiment differs from the first exemplary embodiment is that an analog shift circuit 16 is provided between the first pulse generator 2 and the AFC circuit 3. The same reference numerals are given to components also found in the first and second exemplary embodiments, and thus their explanation is omitted here.

In the synchronize processing circuit shown in FIG. 1, the setting accuracy for the phase and width of the synchronizing signal output from the first pulse generator 2 and the second pulse generator 5 depends on the frequency of the first regeneration clock 8 generated by the first PLL circuit 1. This makes it difficult to supply the synchronizing signal to control circuits which may desirably require more accurate phase adjustment. One way to improve the setting accuracy is to make the frequency of the first regeneration clock 8 higher. However, higher frequency of the first regeneration clock 8 may lead to expanding the circuit scale because the number of bits may desirably require to be increased to control the synchronizing signal in high accuracy as well as to make circuit elements of the first pulse generator 2 and the second pulse generator 5 to correspond to a high-speed clock.

Figure 6:
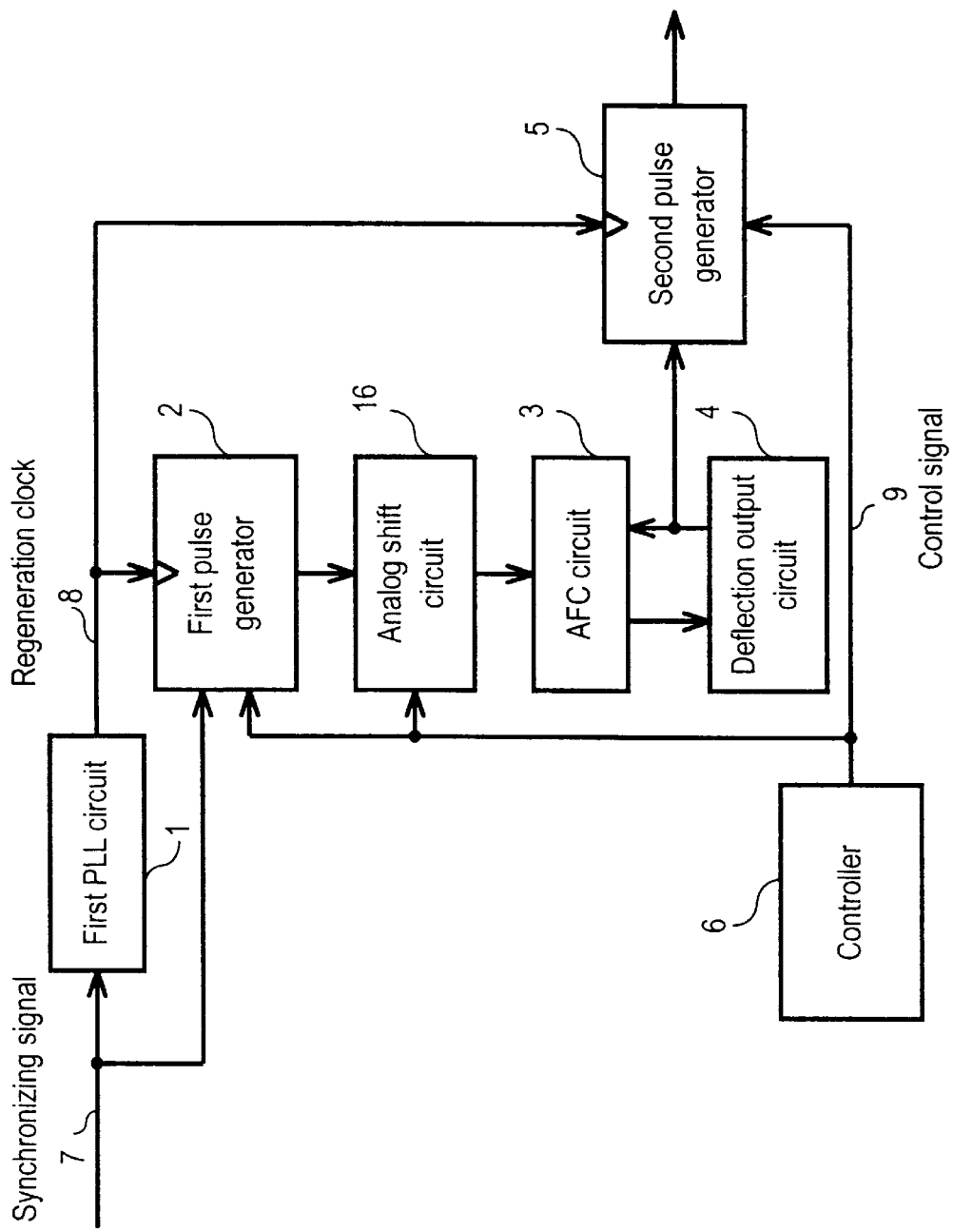
FIG. 6 is a block diagram of a synchronize processing circuit in accordance with a third exemplary embodiment of the present invention.

This exemplary embodiment thus solves the above inconvenience by employing the analog shift circuit 16 configured with the analog element as shown in FIG. 6. The analog shift circuit 16, as shown in FIG. 6, receives the synchronizing signal output from the first pulse generator 2, controls it in accordance with the control signal 9 from the controller 6, and outputs the synchronizing signal to the AFC circuit 3. The circuit operation is the same as that of the prior art configured with the monostable multivibrator shown in FIGS. 13A to 13C. However, the pulse phase setting range of the analog shift circuit 16 in this exemplary embodiment may barely cause degradation on the display device although deviation in the pulse phase setting accuracy may occur due to the phenomenon peculiar to the analog element as explained in the prior art. This is because the pulse phase setting range is as small as a period T shown in FIG. 7C, which is equivalent to one period of the first regeneration clock 8. Thus, there is no inconvenience in practical use. Furthermore, since the analog shift circuit 16 is configured with the analog element, the analog shift circuit 16 can exercise full capability by separating it from the digital circuit using the methods described with reference to the first exemplary embodiment.

Pulse generating circuit 2 changes the phase of each pulse typically of the playback clock frequency generated from first PLL circuit 1. For example, when the playback clock is 10 MHz, the pulse generated by the pulse generating circuit is typically changed in its phase by 100 nsec. The analog shift circuit 16, thus divides a 100 nsec into 10, thus changing the pulse phase to 10 nsec. As a result, phase adjustment with increased accuracy is realized. The analog shift circuit fine adjusts the phase by using techniques which are known to one of ordinary skill in the art.

The analog shift circuit 16 is inserted after the first pulse generator 2 in this exemplary embodiment. However, the same effect is achievable for control circuits in the display device by inserting the same type of analog shift circuit after the second pulse generator 5 at the downstream of the AFC circuit 3.

Accordingly the synchronize processing circuit in this exemplary embodiment upgrades the phase adjustment accuracy of the synchronizing signal is limited by the clock signal frequency which is regenerated by the PLL circuit.

Fourth exemplary embodiment

A synchronize processing circuit in accordance with a fourth exemplary embodiment of the present invention is explained with reference to FIGS. 8 and 9A to 9E. The fourth exemplary embodiment differs from the first exemplary embodiment in that a digital shift circuit 22 is provided between the first pulse generator 2 and the AFC circuit 3 and the configuration of a PLL circuit 101 is different from that of the first PLL circuit 1. The same reference numerals are given to components which are also found in the first and second exemplary embodiments, and thus their explanation is omitted here.

In the synchronize processing circuit of the present invention shown in FIG. 1, accuracy for setting phase and width of the synchronizing signal to be output from the first and second pulse generators 2 and 5 depends on the frequency of the first regeneration clock 8 generated by the first PLL circuit 1. This may cause difficulties in supplying the synchronizing signal to control circuits for which it may be desirable to provide higher accuracy in adjusting the phase. In the third exemplary embodiment, the analog shift circuit 16 configured with the analog element employed. This is satisfactory for normal use, but the phenomenon peculiar to the analog element may cause problems, as explained in the prior art, if it is applied to the multi-tube system, one of usage style of video projectors, which require high stability.

Figure 8:
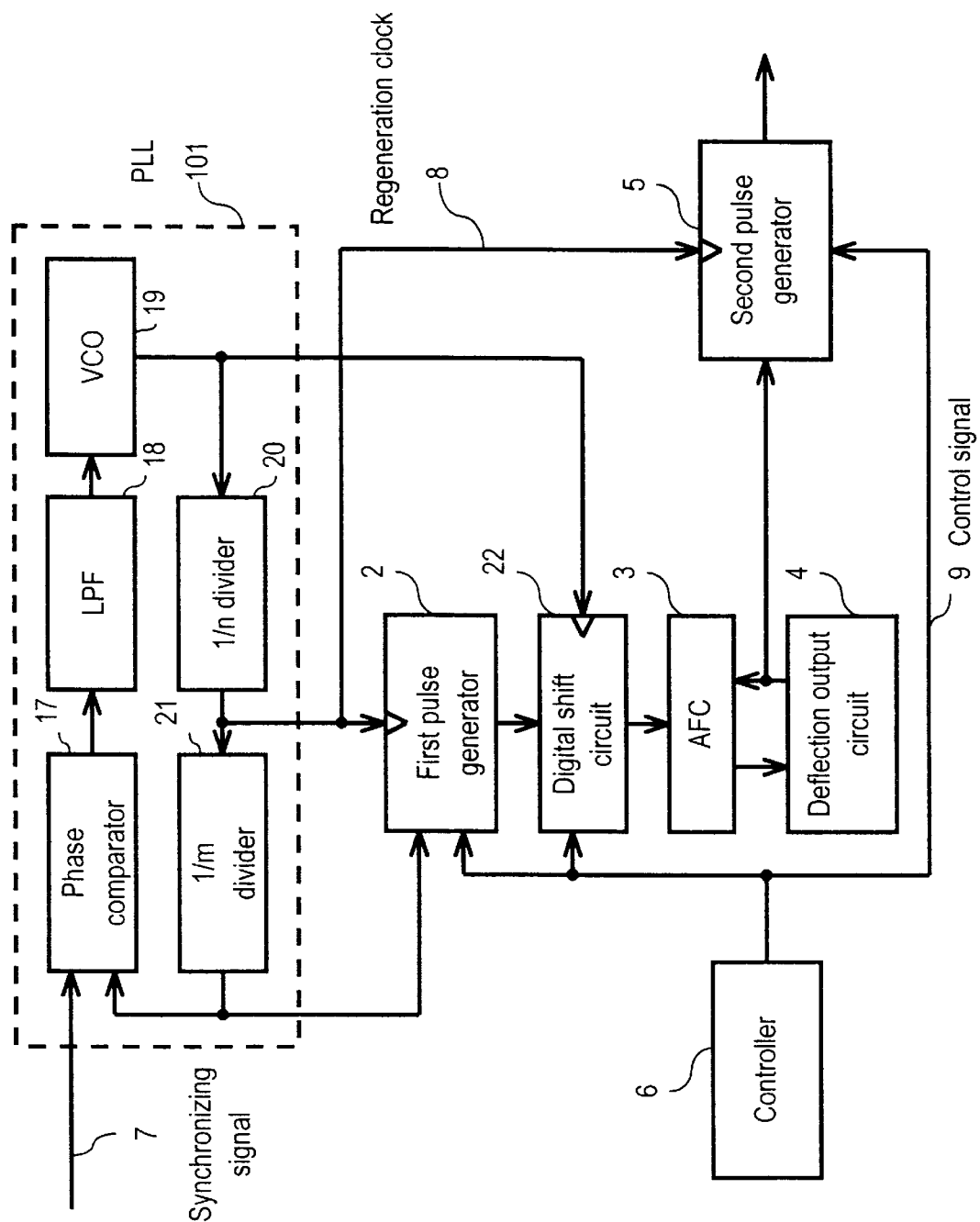
FIG. 8 is a block diagram of a synchronize processing circuit in accordance with a fourth exemplary embodiment of the present invention.
Figure 9:
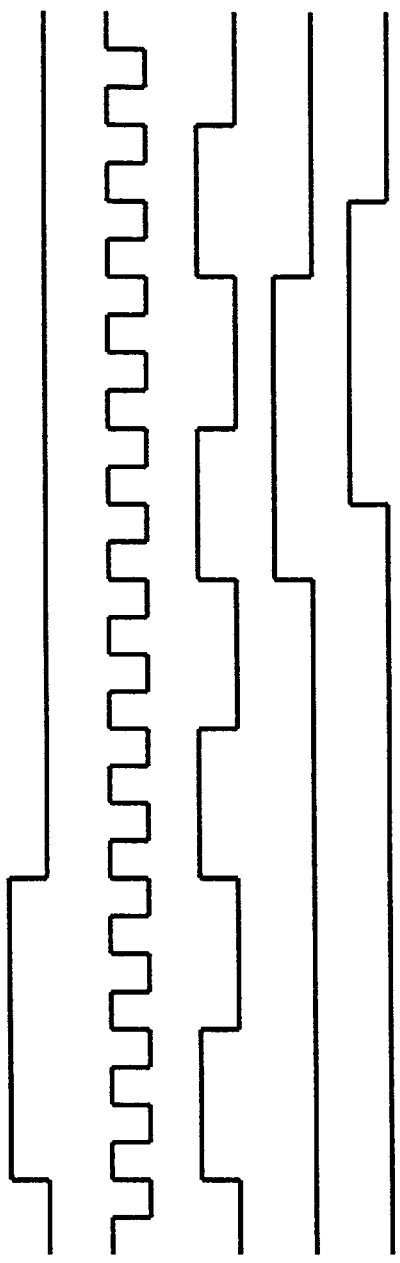
FIGS. 9A to 9E are timing diagrams which are useful for explaining the operation of the synchronize processing circuit in accordance with the fourth exemplary embodiment of the present invention.

The fourth exemplary embodiment therefore forms the digital shift circuit 22 using the digital element as shown in FIG. 8 to solve the problem. The PLL circuit 101 in the fourth exemplary embodiment comprises a phase comparator 17, low pass filter LPF 18, VCO 19, 1/n divider 20, and 1/m divider 21. The operation of the synchronize processing circuit as configured above is explained next.

The synchronizing signal 7 in the external video signal source input to the display device is supplied to one input terminal of the phase comparator 17. The LPF 18 smoothes the output of the phase comparator 17 to convert to DC voltage. The VCO 19 receives DC voltage output from the LPF 18, and outputs a clock in proportion to the input DC voltage. The 1/n divider 20 divides this oscillation clock at a specified dividing ratio n, and the 1/m divider 21 further divides this oscillation clock at a specified dividing ratio m. The phase comparator 17 receives the output of the 1/m divider 21 through the other input terminal, and compares the phases of the two input. If the 1/n divider 20 and 1/m divider 21 are configured in the same way in the PLL circuit 101, the PLL circuit 101 becomes identical to the first PLL circuit 1 shown in FIG. 1. In the case of FIG. 1, the first regeneration clock 8 is the output from the VCO 19. In addition, since both synchronizing signals input to the phase comparator 17 will have the same phase if the PLL circuit 101 is phased, the same operation is executed when either one of the synchronizing signals input to the phase comparator 17 is input to the first pulse generator 2. This operation also applies to the configuration shown in FIGS. 1, 4, and 6.

Using the PLL circuit 101 as configured above, the output of the 1/n divider 20, i.e., the first regeneration clock 8, is supplied to the first pulse generator 2 as a driving clock signal. The first pulse generator 2 receives the control signal 9 and the output of the 1/m divider 21. The setting accuracy for the phase and width of the synchronizing signal output from the first pulse generator 2 is 1/m of one synchronizing signal period. Next, the digital shift circuit 22 is driven by the control signal 9 and the clock signal output from the VCO 19, and receives the synchronizing signal output from the first pulse generator 2. The operation of the digital shift circuit 22 is explained with reference to FIGS. 9A to 9E. The operation of the AFC circuit 3, deflection output circuit 4, second pulse generator 5, and controller 6 is the same as those of the first exemplary embodiment, and thus their explanation is omitted here.

In FIGS. 9A to 9E, the clock signal frequency generated by the VCO 19 built in the PLL circuit against the frequency of the synchronizing signal 7 input to the display device from the outside can be defined:

Clock frequency=Frequency of synchronizing signal×n×m.

The frequency of the first regeneration clock 8 which is created by dividing this clock generated by the VCO 19 to 1/n by the 1/n divider 20 can be defined:

Frequency of regeneration clock=Frequency of synchronizing signal×m.

The first pulse generator 2 outputs a required synchronizing signal using the first regeneration clock 8 which is the output of the 1/n divider 20. The phase of this synchronizing signal depends on the frequency of the first regeneration clock 8 as shown in FIGS. 9A to 9E. The digital shift circuit 22 operates by the clock signal output from the VCO 19 which operates at n times faster speed than the frequency of the first regeneration clock 8, and receives the synchronizing signal output from the first pulse generator 2. The synchronize processing circuit of this exemplary embodiment can thus set the phase of the synchronizing signal with higher accuracy.

As shown in FIG. 8, the size of a circuit block which may require high-speed operation in the synchronize processing circuit can be minimized by configuring dividers in two steps, i.e., the 1/n divider 20 and 1/m divider 21, in the PLL circuit 101.

In this exemplary embodiment, the output of the upstream first pulse generator 2 is supplied to the digital shift circuit 22. However the same effect is achievable by supplying the output of the second pulse generator 5, after passing through the AFC circuit 3, to the digital shift circuit.

Fifth exemplary embodiment

A portion of a controller of the synchronize processing circuit in a fifth exemplary embodiment of the present invention is explained with reference to FIGS. 10 and 11A to 11F. The portion of the configuration which is the same as the previous exemplary embodiments are given the same reference numerals, and thus explanation on those components and their functions is omitted here.

In the first exemplary embodiment, the control range of the control signal 9 for the horizontal synchronizing signal output from the controller 6 which controls the phase and width of the synchronizing signal input to the first pulse generator 2 and the second pulse generator 5 is limited by the dividing ratio of the divider built in the first PLL circuit 1. Accordingly, it is easily detectable in the display device. On the other hand, the control range for the vertical synchronizing signal is limited by the number of scanning lines of the video signal source input to the display device. A processor built in the controller 6 calculates the number of scanning lines of the video signal source using the horizontal and vertical scanning frequencies of the external video signal source input to the display device according to the following Equation:

Number of scanning lines=Horizontal scanning frequency/Vertical scanning frequency.

However, the processor may cause errors in calculating the number of scanning lines in the video signal source input to the display device. If this happens, the pulse generator may not be accurately controlled.

Figure 10:
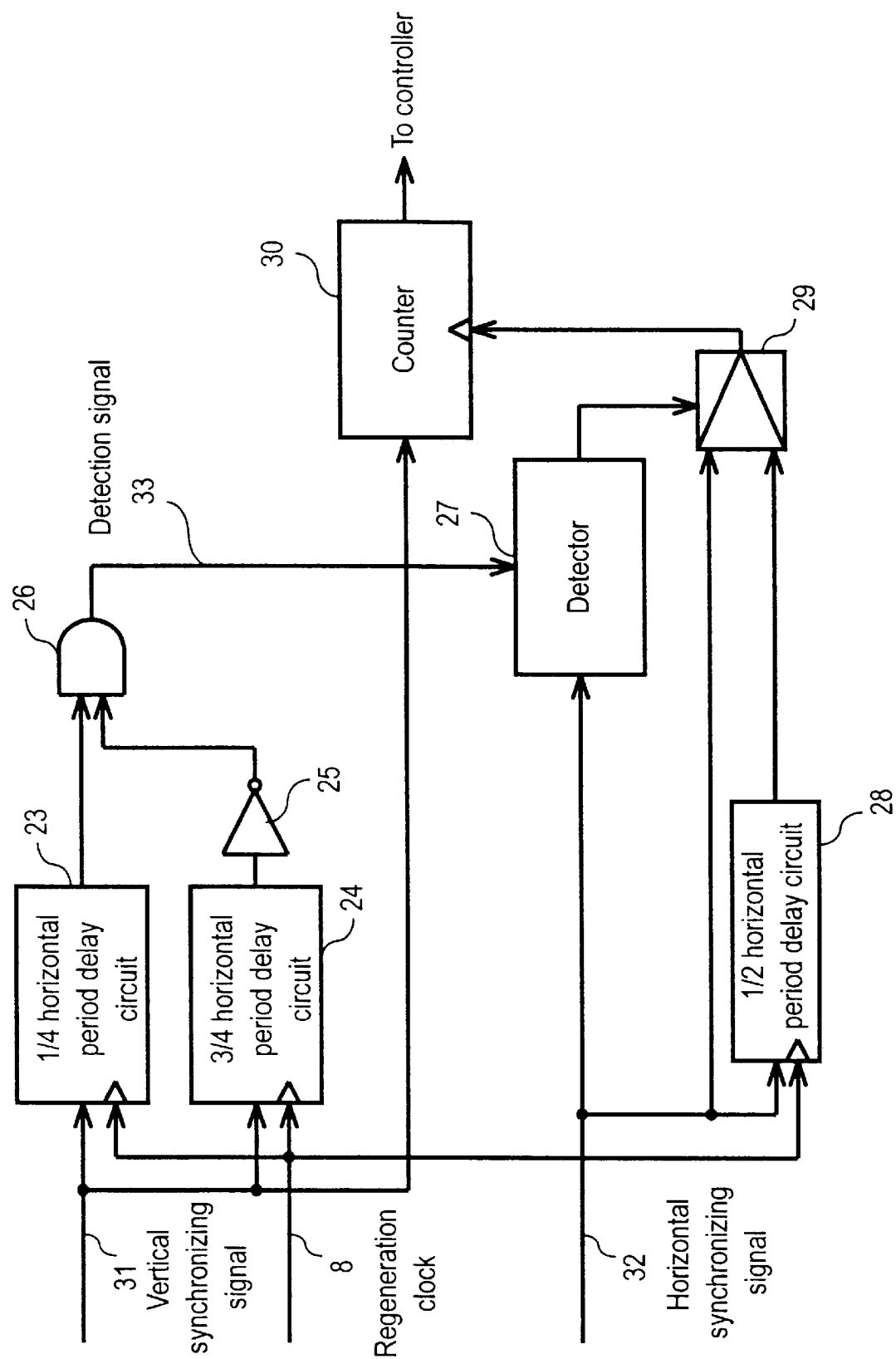
FIG. 10 is a block diagram of a portion of a synchronize processing circuit controller in accordance with a fifth exemplary embodiment of the present invention.

The fifth exemplary embodiment of the present invention offers a controller for the synchronize processing circuit as shown in FIG. 10 which solves this point. The synchronize processing circuit of the fifth exemplary embodiment comprises a ¼ horizontal period delay circuit 23 for delaying the vertical synchronizing signal for the ¼ horizontal period, a ¾ horizontal period delay circuit 24 for delaying the vertical synchronizing signal for the ¾ horizontal period, an inverter 25, an AND circuit 26, a detector 27 for detecting the phase relation between the horizontal and vertical synchronizing signals in the video signal source connected to the display device using the output of the AND circuit 26, an ½ horizontal period delay circuit 28 for delaying the horizontal synchronizing signal for the ½ horizontal period, a multiplexer 29, and a counter 30. A vertical synchronizing signal 31 in the external video signal source input to the display device is supplied to the ¼ horizontal period delay circuit 23, ¾ horizontal period delay circuit 24, and counter 30. A horizontal synchronizing signal 32 in the external video signal source input to the display device is supplied to the detector 27, ½ horizontal period delay circuit 28, and multiplexer 29. The first regeneration clock 8 output from the PLL circuit 1 is supplied to the ¼ horizontal period delay circuit 23, ¾ horizontal period delay circuit 24, and ½ horizontal period delay circuit 28. The operation of the synchronize processing circuit as configured above is explained with reference to FIGS. 11A to 11F.

Figure 11:
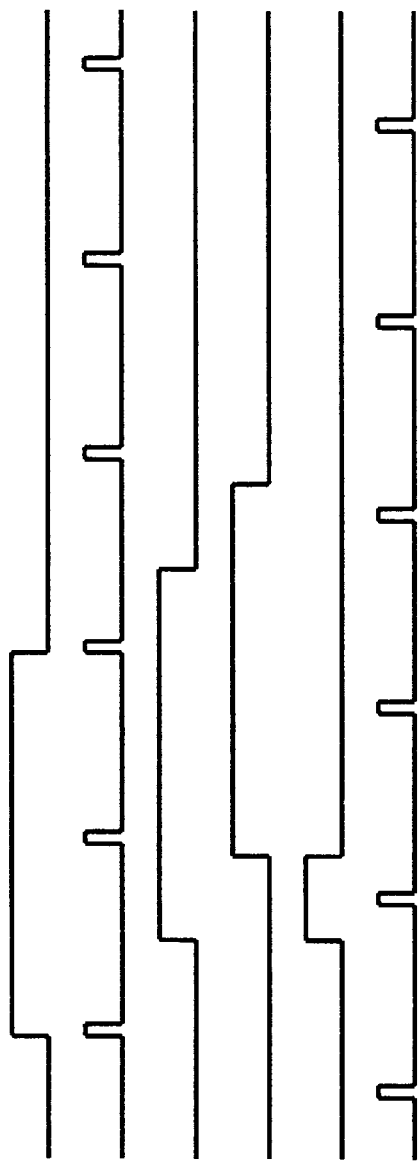
FIGS. 11A to 11F are timing diagrams which are useful for explaining the operation of a portion of the synchronize processing circuit controller in accordance with the fifth exemplary embodiment of the present invention.
Figure 12:
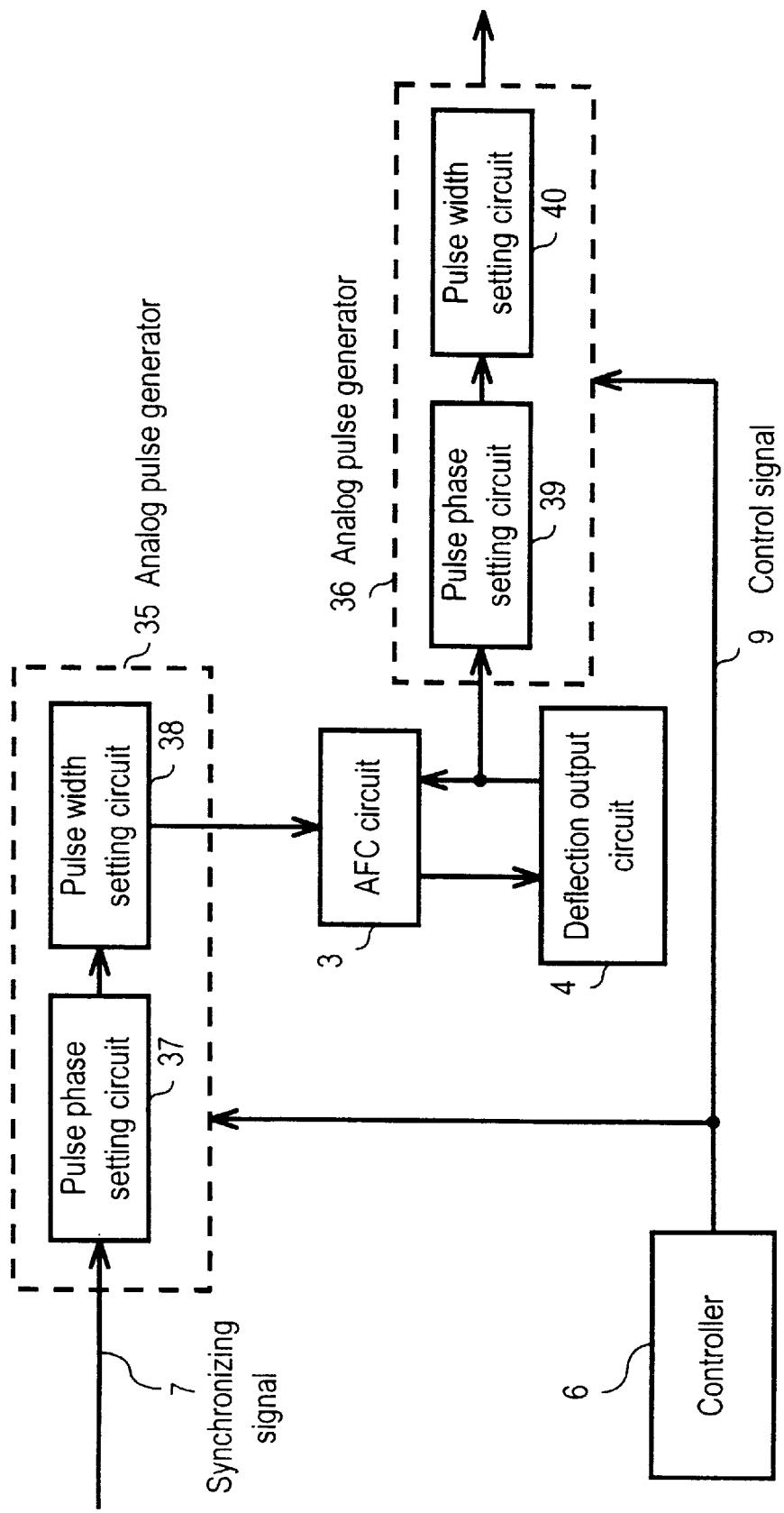
FIG. 12 is a block diagram of a synchronize processing circuit in accordance with the prior art.

The inverter 25 receives a signal output from the ¾ horizontal period delay circuit 24, and the output of the inverter 25 is used as one input to the AND circuit 26. The output of the ¼ horizontal period delay circuit 23 is used as the other input to the AND circuit 26 for obtaining a vertical rate synchronizing signal with a width of the ½ horizontal period as shown in FIG. 11E. In this exemplary embodiment, the vertical rate synchronizing signal generated by the AND circuit 26 as above is called a detection signal 33. The detector 27 receives the detection signal 33 and the horizontal synchronizing signal 32 for detecting the phase relation between the vertical synchronizing signal 31 and horizontal synchronizing signal 32 in the video signal source input to the display device by detecting the presence of the horizontal synchronizing signal pulse in a pulse of this detection signal 33.

For example, as shown in FIGS. 11A and 11B, a pulse of the horizontal synchronizing signal 32 does not exist during a period for detecting the detection signal 33 if phases of the vertical synchronizing signal 31 and horizontal synchronizing signal 32 are extremely close to each other. Conversely, the pulse of the horizontal synchronizing signal 32 is detected during a period for detecting the detection signal 33 if phases of the vertical synchronizing signal 31 and horizontal synchronizing signal 32 are far apart. The ½ horizontal period delay circuit 28 delays the horizontal synchronizing signal 32 for the ½ horizontal period using the first regeneration clock 8, and supplies the delayed signal to one input terminal of the multiplexer 29. The horizontal synchronizing signal 32 is supplied to the other input terminal of the multiplexer 29. The multiplexer 29 supplies its output to the counter 30 based on the result of detection by the detector 27. In other words, if the horizontal synchronizing signal 32 is detected in the pulse of the detection signal 33, the horizontal synchronizing signal 32 is output as it is to the counter 30, and the output of the ½ horizontal period delay circuit 28 is output if the horizontal synchronizing signal 32 is not detected in the pulse of the detection signal 33. This sets the phase of the horizontal synchronizing signal output from the multiplexer 29 always delayed for the ½ horizontal period to the vertical synchronizing signal 31, assuring latching of the vertical synchronizing signal input to the counter 30 by the output of the multiplexer 29.

With the above configuration of this exemplary embodiment, correct calculation of the number of scanning lines of the video signal source input to the display device is assured, and the control of the synchronizing signal having a desired phase and width responsive to the first pulse generator 2 and second pulse generator 5 is ensured by inputting this calculation result to the controller 6.

If the first regeneration clock 8 generated by the first PLL circuit 1 (which is not always in the phase relation directly latchable against the vertical synchronizing signal 31 in the external video signal source input to the display device) is supplied to the ¼ horizontal period delay circuit 23 and ¾ horizontal period delay circuit 24, a latching error may occur at implementing the latching operation. However, there is no latching error on the operation of the circuit of this exemplary embodiment. The ¼ horizontal period and ¾ horizontal period are employed as the amount of delay in the delay circuits 23 and 24 for delaying the vertical synchronizing signal 31 in this exemplary embodiment. However, the same effect is achievable by setting other amounts as long as the detection signal 33 can be output.

The pulse polarity of the input synchronizing signal in the video signal source in this exemplary embodiment is positive, and an example is given for the positive pulse during the detection period of the detection signal 33 in this exemplary embodiment. However, it is apparent that a diversifying circuit configurations of the inverter 25 and circuit are applicable in this exemplary embodiment according to the combination of the polarity of the input synchronizing signal and the polarity of the detection signal 33.

In the multiscan display device which displays video signal sources with different scanning frequencies on one display device, some prior art devices caused a different phase and width control range of the synchronizing signal for one scanning frequency period depending on the scanning frequency of the input video signal source. The present invention addresses this issue by dividing one horizontal scanning period in a fixed rate, by employing the PLL circuit, regardless of the scanning frequency of the synchronizing signal in the external video signal source input to the display device.

The synchronize processing circuit of the present invention employs a digital shift circuit having minute setting range using a clock for high-speed operation of the synchronizing signal output from a pulse generator by combining an analog shift circuit configured with the analog element having a minute variable range or two-step dividers in the PLL circuit. This allows improvement of the phase setting accuracy of the synchronizing signal output from the pulse generator which is limited by the dividing ratio of the divider in the PLL circuit. The synchronizing signal output from the pulse generator is thus settable to a desired phase width with improved accuracy.

A control range of the horizontal synchronizing for controlling the phase and width of the synchronizing signal generated by the pulse generator as desired is limited by the dividing ratio of the divider built in the PLL circuit, which is acceptable. However, the control range for the vertical synchronizing signal is limited by the number of scanning lines of the external video signal source input to the display device, causing errors in detecting the number of scanning lines. The configuration of the present invention enables accurate calculation of the number of scanning lines of the video signal source input to the display device, and ensures the control of the phase and width of the synchronizing signal output from the pulse generator as desired by supplying the calculation result to the controller.

What is claimed is:

1. A synchronize processing circuit comprising:
    a PLL circuit for generating one of a) a regeneration clock which is synchronized to a synchronizing signal of a video signal; and b) a divided signal divided from said synchronizing signal;;
    a controller for generating a control signal;
    a first pulse generator which receives one of said synchronizing signal and said divided signal, said control signal, and said regeneration clock, and which outputs a further synchronizing signal;
    an AFC circuit for outputting an AFC synchronizing signal;
    a deflection output circuit which receives the AFC synchronizing signal, and which feeds back a deflection output synchronizing signal to said AFC circuit; and
    a second pulse generator which receives the deflection output synchronizing signal and said control signal, and which outputs a synchronize processing signal with a specified phase and width.

2. A synchronize processing circuit as defined in claim 1, wherein said AFC circuit receives the further synchronizing signal, and said second pulse generator receives said regeneration clock.

3. A synchronize processing circuit as defined in claim 1 further comprising a second PLL circuit for synchronizing regeneration of said deflection output synchronizing signal to output a further regeneration clock to said second pulse generator; said AFC circuit receiving the further synchronizing signal.

4. A synchronize processing circuit as defined in claim 1 further comprising an analog shift circuit which rec ives the further synchronizing signal and said control signal, and which outputs a synchronizing signal to said AFC circuit; and said second pulse generator receiving said regeneration clock.

5. A synchronize processing circuit as defined in claim 1 further comprising an analog shift circuit which receives the synchronize processing signal output from said second pulse generator and said control signal, and which outputs a synchronizing signal; and said first pulse generator outputting the further synchronizing signal to said AFC circuit.

6. A synchronize processing circuit as defined in claim 1, said PLL circuit comprising:
    a phase comparator which receives the synchronizing signal in said video signal;
    an LPF circuit for smoothing the output signal of said phase comparator;
    a VCO circuit which receives the output signal of said LPF circuit;
    a 1/n divider for dividing a clock output from said VCO circuit to 1/n; and
    a 1/m divider for dividing the output signal of said 1/n divider to 1/m, and outputting an output signal to said phase comparator;
    said first pulse generator receiving a dividing output signal of the divider built in said PLL circuit, said dividing output signal being the output signal of said 1/m divider, and said regeneration clock input to said first pulse generator being the output signal of said 1/n divider;
    said second pulse generator receiving the output signal of said 1/n divider; and
    said synchronize processing circuit further comprising a digital shift circuit which receives the further synchronizing signal output from said first pulse generator, said control signal, and the output signal of said VCO circuit, and outputs a synchronizing signal to said AFC circuit.

7. A synchronize processing circuit as defined in claim 1, said PLL circuit comprising:
    a phase comparator which receives the synchronizing signal in said video signal;
    an LPF circuit for smoothing the output signal of said phase comparator;
    a VCO circuit which receives the output signal of said LPF circuit;
    a 1/n divider for dividing a clock output from said VCO circuit to 1/n; and
    a 1/m divider for dividing the output signal of said 1/n divider to 1/m, and outputting an output signal to said phase comparator;
    said first pulse generator receiving a dividing output signal of the divider built in said PLL circuit, said dividing output signal being the output signal of said 1/m divider, and said regeneration clock input to said first pulse generator being the output signal of said 1/n divider;
    said AFC circuit receiving the synchronizing signal output from said first pulse generator;
    said second pulse generator receiving the output signal of said 1/n divider; and
    said synchronize processing circuit further comprising a digital shift circuit which receives the synchronize processing signal output from said second pulse generator, said control signal, and the output signal of said VCO circuit, and outputs a synchronizing signal.

8. A synchronize processing circuit as defined in claim 1, wherein said controller delays a vertical synchronizing signal input from the outside for a ¼ horizontal scanning period and ¾ horizontal scanning period using the regeneration clock generated by said PLL circuit for detecting the phase of the vertical synchronizing signal to the horizontal synchronizing signal input from the outside; and the phase of said horizontal synchronizing signal is sustained in a phase relation which makes said vertical synchronizing signal latchable in order to calculate the number of scanning lines of the video signal input from the outside.

9. A synchronize processing circuit as defined in claim 1, wherein said controller further comprising:
    a ¼ horizontal scanning period delay circuit for delaying a vertical synchronizing signal input from the outside for a ¼ horizontal scanning period using said regeneration clock;
    a ¾ horizontal scanning period delay circuit for delaying said vertical synchronizing signal for a ¾ horizontal scanning period using said regeneration clock;
    an inverter for inverting the output signal of said ¾ horizontal scanning period delay circuit;
    an AND circuit which receives the output signal of said inverter and the output signal of said ¼ horizontal scanning period delay circuit;

a ½ horizontal scanning period delay circuit for delaying a horizontal synchronizing signal input from the outside for a ½ horizontal scanning period using said regeneration clock;

a detector which receives said horizontal synchronizing signal and the output signal of said AND circuit for detecting the phase relation between said horizontal synchronizing signal and said vertical synchronizing signal;

a multiplexer which receives the output signal of said detector, said horizontal synchronizing signal, and the output signal of said ½ horizontal scanning period delay circuit, and outputs:

said horizontal synchronizing signal as it is when said horizontal synchronizing signal is detected in the output signal of said detector and the output signal of said ½ horizontal period delay circuit when said horizontal synchronizing signal is not detected in the output signal of said detector; and a counter for counting said vertical synchronizing signal using the output signal of said multiplexer as a clock.

10. A synchronize processing circuit as defined in claim 1, wherein each of said first pulse generator and second pulse generator comprising:

a first counter which receives the synchronizing signal of said video signal from its reset terminal and is driven by said regeneration clock;

a first comparator which receives the output signal from said first counter and said control signal;

a second counter which receives the output signal of said first comparator from its reset terminal, and is driven by said regeneration clock; and a second comparator which receives the output signal of said second counter and said control signal.

11. A synchronize processing circuit as defined in claim 10, wherein a judgment logic of said first comparator is to output "1," when both input signals are equivalent, and a judgment logic of said second comparator is to output "1," when the output of said second counter is equivalent to a value of said control signal and below.

* * * * *

UNITED STATES PATENT AND TRADEMARK OFFICE
CERTIFICATE OF CORRECTION

PATENT NO. : 6,172,711 B1
DATED : January 9, 2001
INVENTOR(S) : J. Masumoto et al.

Page 1 of 1

It is certified that error appears in the above-identified patent and that said Letters Patent is hereby corrected as shown below:

Title page,
Item "[56] References Cited" insert:

-- References Cited --
U.S. PATENT DOCUMENTS

| | | |
|---|---|---|
| 4,498,103 | 2/5/85 | Ashwanden |
| 4,860,090 | 8/22/89 | Murata et al. |

FOREIGN PATENT DOCUMENTS 0,625,848   11/23/94   EPO

OTHER DOCUMENTS

Search Report corresponding to Application No. EP 98 10 2685 dated 5/28/98

Column 13,
Line 41, delete "rec ives" and insert -- receives --.

Signed and Sealed this

Sixth Day of November, 2001

*Attest:*

NICHOLAS P. GODICI
*Attesting Officer*   Acting Director of the United States Patent and Trademark Office